(12) United States Patent
Koch et al.

(10) Patent No.: US 7,561,978 B2
(45) Date of Patent: Jul. 14, 2009

(54) DEVICE AND METHOD FOR BATTERY STATE DETERMINATION

(75) Inventors: Ingo Koch, Hameln (DE); Eberhard Meissner, Wunstorf (DE)

(73) Assignee: VB Autobatterie GmbH & Co. KGaA, Hannover (DE)

( * ) Notice: Subject to any disclaimer, the term of this patent is extended or adjusted under 35 U.S.C. 154(b) by 0 days.

(21) Appl. No.: 11/898,930

(22) Filed: Sep. 17, 2007

(65) Prior Publication Data

US 2008/0071484 A1    Mar. 20, 2008

(30) Foreign Application Priority Data

Sep. 18, 2006    (DE) .................... 10 2006 044 354.3

(51) Int. Cl.
*G06F 3/00*    (2006.01)
(52) U.S. Cl. .............................. 702/63; 702/65; 702/67; 702/179
(58) Field of Classification Search ............. 702/63–65, 702/117, 150, 179, 182, 185; 320/127, 128, 320/132, 116, 124; 324/433, 434; 340/635, 340/636
See application file for complete search history.

(56) References Cited

U.S. PATENT DOCUMENTS

| | | | | |
|---|---|---|---|---|
| 4,633,418 | A | * | 12/1986 | Bishop ........................ 702/63 |
| 5,349,540 | A | | 9/1994 | Birkle et al. |
| 5,789,923 | A | | 8/1998 | Shimoyama et al. |
| 6,332,113 | B1 | * | 12/2001 | Bertness ....................... 702/63 |
| 6,534,954 | B1 | * | 3/2003 | Plett ............................ 320/132 |
| 6,856,940 | B2 | * | 2/2005 | Loehr et al. .................. 702/182 |
| 7,012,434 | B2 | * | 3/2006 | Koch ........................... 324/427 |

| | | | |
|---|---|---|---|
| 2003/0115232 | A1 | 6/2003 | Lipp |

(Continued)

FOREIGN PATENT DOCUMENTS

DE    4014737 A1    11/1990

(Continued)

OTHER PUBLICATIONS

European Search Report and Written Opinion for EP Application No. 07 01 7561.7-1236; dated Jan. 10, 2008; 6 pages.

(Continued)

*Primary Examiner*—Eliseo Ramos Feliciano
*Assistant Examiner*—Felix E Suarez
(74) *Attorney, Agent, or Firm*—Foley & Lardner LLP

(57) ABSTRACT

A method for determining the state of a battery includes receiving measurements representative of at least one of a battery terminal voltage and a battery terminal current from a first unit and using a second unit to determine at least one characteristic variable for a battery state from at least one of the measured battery terminal voltage and the measured battery current. The method also includes using a microprocessor to statistically assess the at least one characteristic variable for the battery state by performing a statistical process check. The method further includes defining an observation window for the at least one characteristic variable within which the at least one characteristic variable is assumed to be steady-state and identifying an implausible value, which is not caused by the battery, for the at least one characteristic variable if the scatter of the at least one characteristic variable exceeds a defined scatter limit.

16 Claims, 3 Drawing Sheets

U.S. PATENT DOCUMENTS

2004/0128089 A1     7/2004     Barsoukov et al.

FOREIGN PATENT DOCUMENTS

| | | |
|---|---|---|
| DE | 19540827 | 5/1996 |
| DE | 199 59 019 A1 | 6/2001 |
| DE | 10231700 | 1/2004 |
| DE | 10335928 | 3/2005 |
| EP | 1094326 A2 | 4/2001 |
| EP | 1353190 | 10/2003 |
| JP | 2002-063944 M | 2/2002 |

OTHER PUBLICATIONS

Response to European Search Report and Written Opinion for EP Application No. 07 01 7561.7-1236; dated Sep. 15, 2008; 8 pages.
German Office Action for German Application No. DE 10 2006 044 354.3-34, dated Feb. 4, 2009; 3 pages.

* cited by examiner

DEVICE AND METHOD FOR BATTERY STATE DETERMINATION

BACKGROUND

The present invention relates to a method and device for battery state determination.

A very wide range of methods are known and have been proven in practical use for determination of the state of a battery, in particular of a rechargeable battery (e.g., a lead-acid rechargeable battery which is used as a starter battery in motor vehicles).

By way of example, EP 1 353 190 A1 discloses a method for determination of the wear of an electrochemical storage battery, in which the amounts of charge converted are determined continuously during the storage cycles of the energy store, and a wear variable which characterizes loss of storage capacity is calculated as a function of the determined amount of charge converted. This makes use of the fact that the charging process governs the structural changes which cause the wear in the electrochemically active materials in the energy store, and overcharging, which affects the wear, is also taken into account. The process of continuously determining the amounts of charge converted makes use of the fact that the loss of storage capability increases progressively as the amount of charge converted during the charging cycles increases, and that the discharge cycles have no significant influence on this loss.

Methods are also known for battery state determination, for example, from DE 195 40 827 C2, in which battery-specific families of characteristics of battery aging are used in order to determine a battery aging value, with the aid of the family of characteristics from recorded instantaneous values of the battery aging influencing variables.

By way of example, DE 103 35 928 A1 discloses a method for determination of the state of charge of a characteristic variable which is related to the storage battery, in which a first state of charge value, which is related to the rest voltage of the battery, and a second state of charge value, which is related to the amount of charge converted, are determined. The two state of charge values are evaluated to determine the change in their state of charge, in order to derive a characteristic variable for the battery state from the two state of charge changes.

DE 102 317 00 A1 discloses a method for determination of the amount of charge which can still be drawn from a battery, by measurement of the battery current and voltage values at at least two times before and during a rise phase and during or after a decay phase of a charging or discharge process.

These and other methods for battery state determination are used in vehicles in order to ensure that the battery is currently carrying out its tasks, and will carry out its tasks in the future. A wide range of further functions are built on the information relating to battery state identification and have no visible effects for the driver of the vehicle. For example, loads such as seat heating are switched off when a low state of charge SOC and/or a specific state of health SOH of the battery state identification are/is found. The accuracy and the stability of the results of the battery state identification therefore play an important role. The accuracy of battery state identification can be ensured by means of appropriate algorithms and measurement techniques. The stability of the results must, however, be monitored separately. Output variables from the battery state identification, such as the state of health SOH or the loss of capacity Qv, are based on different input variables, such as the battery terminal current, the battery terminal voltage, the temperature and internal state variables, such as the internal resistance, the battery temperature from a battery temperature model, etc. If a major error occurs for any reason whatsoever in one of the measurement variables, input variables or state variables, this has immediate effects on the output variables. However, it may also frequently be necessary to identify rapid changes in the battery state as such. For example, it may be important to identify a rapid increase in the loss of capacity. In this case, it is then necessary to decide whether this is an actual change in the battery, or a result of normal scatter or spurious values of the measurement, input or state variables.

It would be advantageous to provide an improved method and device for battery state determination.

SUMMARY

An exemplary embodiment relates to a method for battery state determination that includes statistically assessing at least one determined characteristic variable for the battery state by means of a statistical process check.

Another exemplary embodiment relates to a device for battery state identification that includes a unit for measuring at least one of battery terminal voltage and battery terminal current and a unit for determining at least one characteristic variable for the battery state from at least one of the measured battery terminal voltage and the measured battery current. The device also includes an assessment unit configured to statistically assess the at least one determined characteristic variable using a statistical process check.

BRIEF DESCRIPTION OF THE DRAWINGS

The invention will be explained in more detail in the following text, using the attached drawings by way of example, in which.

DETAILED DESCRIPTION

Figure 1:
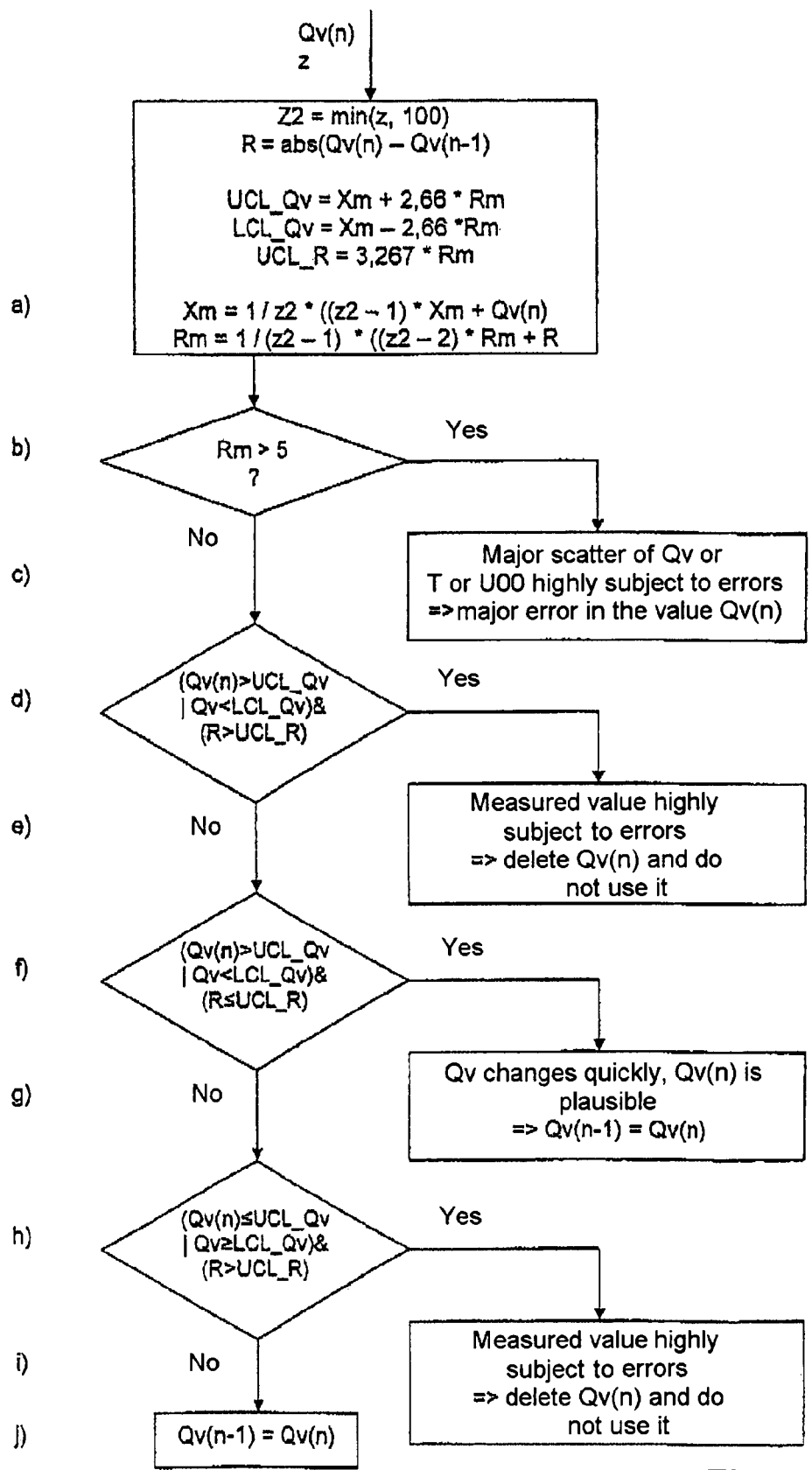
FIG. 1 shows a flowchart of one embodiment of the method for battery state determination with statistical assessment of the determined characteristic variables.

According to an exemplary embodiment, a device for battery state determination is provided that has a measurement unit for the battery terminal voltage and/or the battery terminal current, and having a unit for determination of at least one characteristic variable for the battery state from the measured battery terminal voltage and/or the battery terminal current.

According to another exemplary embodiment, a method for battery state determination is provided that utilizes a statistical assessment of at least one determined characteristic variable for the battery state by means of a statistical process check.

The major methods for statistical process checking are quality control charts. The fundamental procedure is described, for example, in www.statsoft.com/textbook/stquacon.html, as follows:

The general procedure for on-line quality control is straightforward: values of a specific variable are simply extracted from the ongoing production process. Line diagrams of the variability of these values are then produced, and their proximity to objective requirements is then determined. If a trend is found in these lines, or if values infringe predetermined limits, the process is declared to be out of control, and measures are taken to find the cause of the problem. These types of diagrams are sometimes also referred to as Shewhart control charts (named after W. A. Shewhart, who is generally regarded as the first person to introduce these methods).

The application of statistical process checking methods to the output variables for battery state identification makes it possible in a simple and reliable manner to discover spurious values of the characteristic variables, and to detect major changes in the trend of the output characteristic variables.

Statistical process checking methods are described, for example, in Douglas C. Montgomery: Introduction to Statistical Quality Control, 5th ed., International edition, Hoboken N.J. Wiley 2005. In the past, methods for statistical process checks have been used in particular for quality control in production processes.

The method described according to an exemplary embodiment herein makes use of the knowledge that the statistical process checking methods can also be applied to the results of battery state identification algorithms, even though derived variables are assessed rather than measurement variables, and there are no steady-state processes either. Battery state recording is in this case considered to be a process which can be analyzed statistically.

The characteristic variable of a battery may be not only the state variable of a battery, such as the state of charge, temperature, or loss of capacity, but also a rate of change of one of the state variables, since this can represent an important variable for characterization of a battery, for example the rate of change of the loss of capacity.

The statistical assessment of the at least one characteristic variable is preferably carried out by (a) definition of an observation window for the at least one characteristic variable, within which the at least one characteristic variable is assumed to be steady-state, and (b) identification of a rapid change in a determined characteristic variable if the at least one characteristic variable exceeds defined check limits and the scatter of the characteristic variable does not exceed a defined scatter limit.

Alternatively or additionally, the statistical assessment of the at least one characteristic variable can also be carried out by (a) definition of an observation window for the at least one characteristic variable, within which the at least one characteristic variable is assumed to be steady-state, and (b) identification of an implausible value, which is not caused by the battery, for a determined characteristic variable if the scatter of the characteristic variables exceeds a defined scatter limit.

The observation window takes account of the fact that the state of a battery varies continuously. The observation window is preferably a time window which, for example, can be chosen as a function of the dynamics of the characteristic variable. However, the observation window may also be an event numerical window with a number of successively determined values considered for the characteristic variable. Only values of the at least one characteristic variable which are within the observation window are then considered in the statistical assessment.

Furthermore, an implausible value of a determined characteristic variable can be assumed, for example, if the absolute value of the mean scatter is greater than a defined scatter limit value.

One characteristic variable, by way of example, may be the loss of capacity of a rechargeable battery, in particular of a lead-acid battery for a motor vehicle.

The statistical assessment can be carried out using methods known from statistical process checking, such as a quality control chart (I&MR chart) or the like, or may be carried out in particular on a computer-aided basis.

According to an exemplary embodiment, the device includes an assessment unit which is designed for statistical assessment of the at least one determined characteristic variable at least by means of a statistical process check using the method described above. The assessment unit is preferably a microcontroller or microprocessor provided with a suitable program. By way of example, a central processor which is also responsible for engine management control can be used as the microprocessor.

FIG. 1 shows a flowchart of one exemplary embodiment of the method for battery state determination with statistical assessment of at least one determined characteristic variable (Z) for the battery state by means of a statistical process check.

In the example, the output variable of a battery state identification method which is known per se is the loss of capacity $Qv(n)$ per time or event number n. The loss of capacity $Qv(n)$ is quoted in percentage units. Furthermore, the number z relates to the valid outputs of values for the capacity loss Qv.

Since the algorithms for determination of the characteristic variable Qv are sufficiently well known from the prior art, for example from DE 102 317 00 A1, and are irrelevant for the further procedure in the specific algorithm that is used to determine the loss of capacity Qv, this will not be described in any more detail here. In fact, it should be understood that the method described in the following text can be applied to virtually any desired algorithm for battery state identification, and can be used in combination with it.

The methods known from statistical process checking, such as an I&MR Chart, are applied to the output variable, for example the loss of capacity Qv, of the battery state identification algorithm.

In a first step (a), values for the mean value Xm for the loss of capacity Qv and the mean value Rm of the scatter of the values for the loss of capacity Qv are initialized. An observation window is defined, which may cover a defined time period or a defined number of values of the output variables. Since the state of the battery varies continuously, the observation window must be chosen to be appropriately small. The size of the observation window is governed by the dynamics of the characteristic variable z under consideration, that is to say in the present example, by the dynamics of the loss of capacity Qv. In the described example, the observation window for the loss of capacity Qv is restricted to 100 values. A numerical variable z2 is defined for this purpose, based on the equation:

$$z2 = \min(z, 100).$$

The chosen variable for the observation window of 100 values corresponds to about 50 days, based on the assumption of two engine starts per day. This is plausible since the change in the loss of capacity Qv over 50 days is normally considerably less than the scatter R.

The scatter variable for the characteristic variable Z is calculated, for example, using the formula:

$$R = abs(Qv(n) - Qv(n-1)),$$

where Q(n−1) is the previous value for the loss of capacity Qv prior to the current value Qv(n).

In practice, there are problems in calculation of the mean values Xm and Rm, since too many values must be stored. In the illustrated example, a type of low-pass filter is therefore used to calculate the mean value. The new mean value Xm(n) for the loss of capacity Qv is then calculated using the formula:

$$Xm(n) = 1/(z2-1) \cdot ((z2-2) \cdot Xm(n-1) + Qv(n))$$

where Xm(n−1) is the previously calculated (old) value for the mean value of the loss of capacity.

The new mean value for the scatter variable R, that is to say the mean scatter Rm(n), is calculated using the formula:

$$Rm(n) = 1/z2 \cdot ((z2-1) \cdot Rm(n-1) + R),$$

where Rm(n−1) is the previously calculated (old) value for the mean scatter.

The mean values Xm and Rm are calculated after checking the upper and lower control limits UCL_Qv, LCL_Qv and UCL_R.

The upper control limit UCL_Qv for the current loss of capacity Qv(n) is calculated, for example, using the formula:

$$UCL\_Qv = Xm(n) + 2.66 \cdot Rm(n).$$

The lower control limit LCL_Qv for the current loss of capacity Qv(n) is calculated, for example, using the formula:

$$LCL\_Qv = Xm(n) - 2.66 \cdot Rm(n).$$

The upper control limit for the scatter variable R is calculated, for example, using the formula:

$$UCL\_R = 3.267 \cdot Rm(n).$$

A check is carried out in a step (b) to determine whether the mean value of the scatter Rm exceeds a defined scatter limit of, for example, five. If this is the case, a check is carried out in step (c) to determine whether the measurements have a major scatter and whether the input variables of the algorithm for determination of the loss of capacity Qv, in particular the temperature or the rest voltage $U_{oo}$, are subject to major errors. This indicates that there is a major error in the current value of the loss of capacity Qv. This specific individual value Qv(n) can then simply be ignored for subsequent vehicle or battery control.

In the situation in which the mean scatter Rm does not exceed the defined scatter limit value of, for example five, a check is carried out in step (d) to determine whether the current value for the loss of capacity Qv(n) is greater than the upper limit value UCL_Qv for the loss of capacity Qv, or is less than the lower limit value LCL_Qv for the loss of capacity Qv, and at the same time whether the scatter R is greater than the upper control limit UCL_R for the scatter R. If this is the case, the current value of the loss of capacity Qv(n) is deleted and is not used again, since the individual value Qv(n) is subject to major errors (step (e)).

Otherwise, a check is carried out in a step (f) to determine whether the current value Qv(n) is greater than the upper limit value UCL_Qv for the loss of capacity Qv, and at the same time whether the scatter R is less than or equal to the upper limit value UCL_R for the scatter. If this is the case, a check is carried out in step g) to determine whether the value of the loss of capacity Qv is varying rapidly, but is plausible. In order to prepare for the next iteration step, the instantaneous current value for the loss of capacity Qv(n) is set as the old value for the loss of capacity Qv(n−1) in the next iteration step (step (g)).

Otherwise, a check is carried out in a step (h) to determine whether the current value for the loss of capacity Qv(n) is less than or equal to the upper limit value UCL_Qv and is greater than or equal to the lower limit value LCL_Qv for the loss of capacity Qv, and whether the scatter R is greater than the upper limit value for the scatter R. An assessment is therefore carried out as to whether the value of the loss of capacity Qv is within the upper and lower limit values, and whether only the scatter R exceeds the defined scatter limit UCL_R. If this is the case, step (i) is used to identify whether the measured value may be subject to major scatter, but no further action is required. This specific individual value Qv(n) can then simply be ignored for subsequent vehicle or battery control.

Otherwise, in a step (j), the instantaneous current value for the loss of capacity Qv(n) is simply set as the old value for the loss of capacity Qv(n−1) in the next iteration step, to prepare for this next iteration step, and the instantaneous current value for the loss of capacity Qv(n) is used for further control of the battery or of the vehicle.

Figure 2:
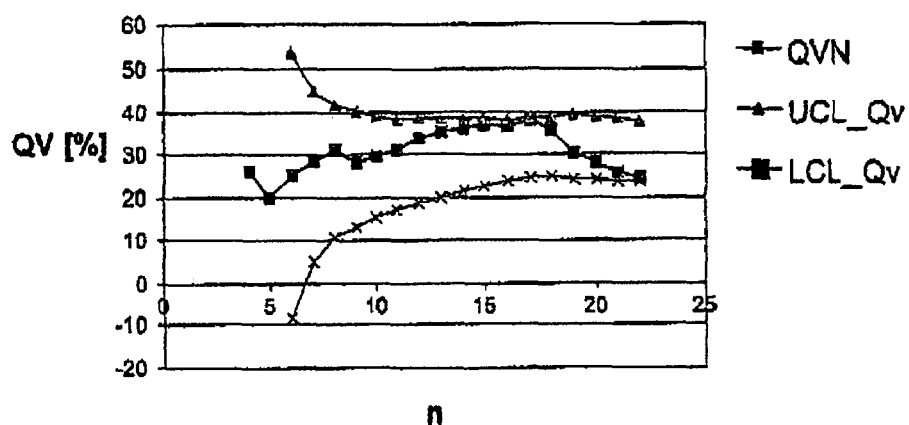
FIG. 2 shows a diagram of the loss of capacity with lower and upper limit values over a number of event numbers.
Figure 3:
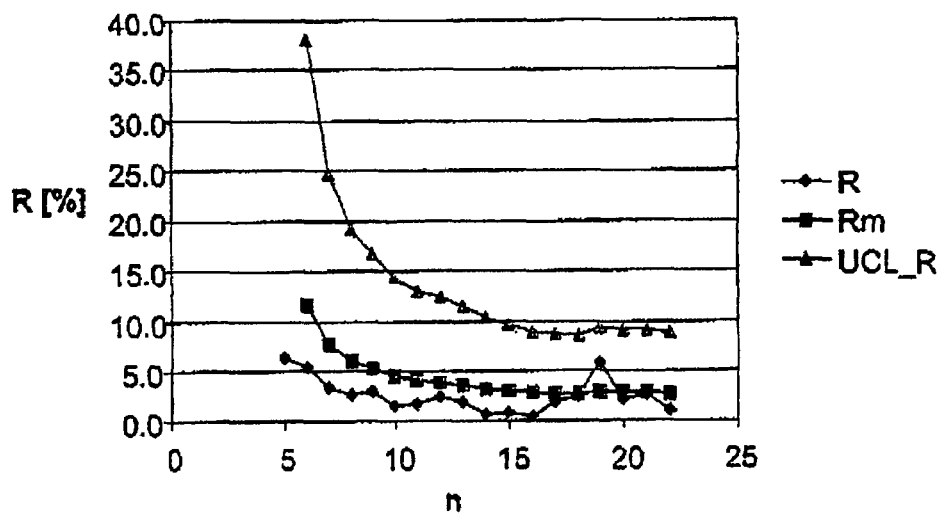
FIG. 3 shows a diagram of a scatter variable of the mean scatter and of an upper control limit for the scatter, over a number of event numbers.

FIGS. 2 and 3 show diagrams of the loss of capacity Qv and of the scatter R as a percentage over a number n of event numbers in conjunction with the upper limit value UCL_Qv and the lower limit value LCL_Qv, and the upper limit value UCL_R. The diagrams illustrated in FIGS. 2 and 3 result from exemplary applications of the method for battery state determination. These FIGURES clearly show that the determined values for the loss of capacity Qv(n) vary within the defined limits. This means that the results are stable. No spurious values of the measurement, input or state variables or major trends have been found.

Figure 4:
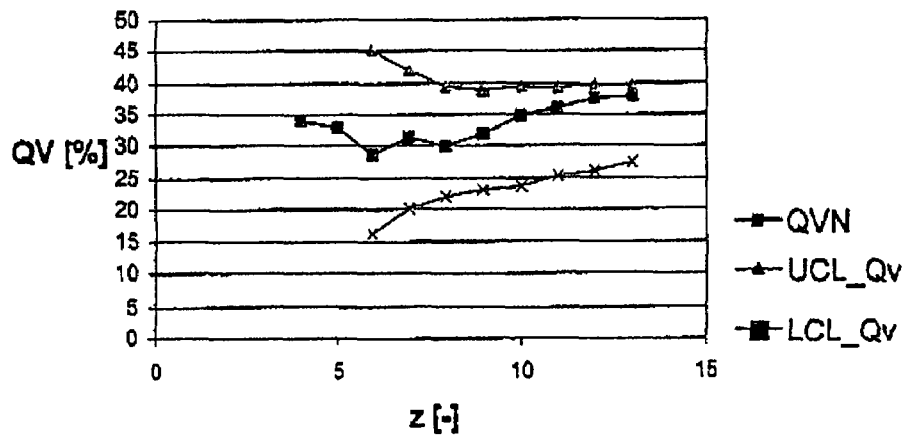
FIG. 4 shows a diagram of a further example of the loss of capacity, with an upper and lower control limit, over a number of event numbers.
Figure 5:
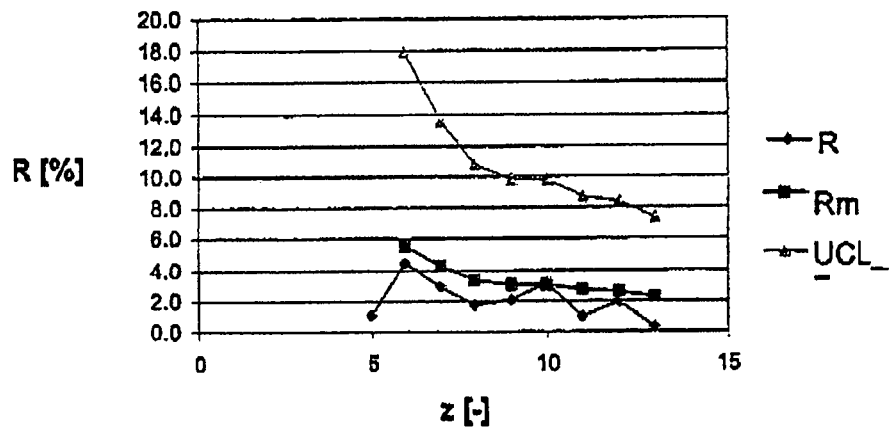
FIG. 5 shows a diagram of the scatter variable, of the mean scatter and of an upper control limit for the scatter, over a number of event numbers for the example shown in FIG. 4.

FIGS. 4 and 5 once again show diagrams of the loss of capacity Qv and of the scatter R over a number n of event numbers with the upper and lower limit values UCL_Qv, LCL_Qv and UCL_R. In this example as well, the determined values Qv(n) vary within the defined limits. The results are likewise stable and no spurious values or major trends have been found.

Figure 6:
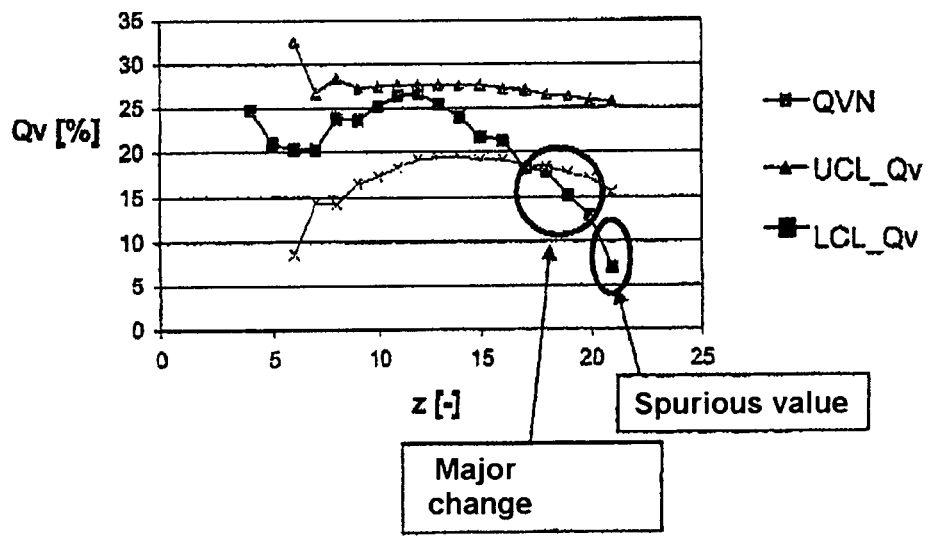
FIG. 6 shows a diagram of a further example of the loss of capacity with an upper and a lower control limit, over a number of event numbers.
Figure 7:
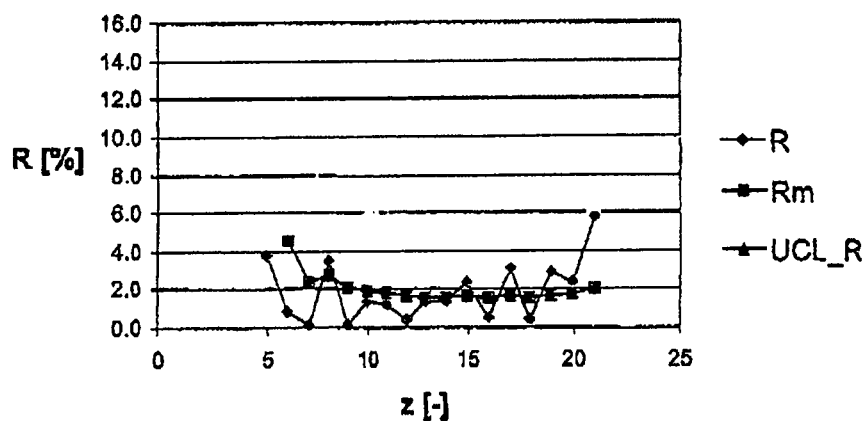
FIG. 7 shows a diagram of the control variable, of the mean scatter and of an upper control limit for the scatter, over the number of event numbers for the example shown in FIG. 6.

FIGS. 6 and 7 show a further example in the form of a diagram of the loss of capacity Qv and of the scatter R over a number n of event numbers. This clearly shows, for example in the case of an event number of 17, the current value for the loss of capacity Qv(n) is below the lower limit value LCL_Qv for the loss of capacity Qv(n). A major change in the loss of capacity Qv is deduced from this. The determined values for the loss of capacity Qv(n) are nevertheless plausible. The final measured value for the loss of capacity Qv(n) reveals that the upper limit value UCL_R for the scatter R has been exceeded, which means that the measured value for the loss of capacity Qv(n) is implausible, because this limit value has been exceeded, and that the last measured value is a spurious value, which is ignored in the rest of the process.

This Application claims priority to German Patent Application No. 10 2006 044 354.3-34 filed Sep. 18, 2006, the entire disclosure of which (including the specification, drawings, claims and abstract) is incorporated herein by reference.

It should be noted that references to relative positions (e.g., "top" and "bottom") in this description are merely used to identify various elements as are oriented in the accompanying drawing FIGURES. It should be recognized that the orientation of particular components may vary greatly depending on the application in which they are used.

For the purpose of this disclosure, the term "coupled" means the joining of two members directly or indirectly to one another. Such joining may be stationary in nature or moveable in nature. Such joining may be achieved with the two members or the two members and any additional intermediate members being integrally formed as a single unitary body with one another or with the two members or the two members and any additional intermediate members being attached to one another. Such joining may be permanent in nature or may be removable or releasable in nature.

It is also important to note that the specific embodiments described herein are intended to be illustrative only. Although only a few embodiments have been described in detail in this disclosure, those skilled in the art who review this disclosure will readily appreciate that many modifications are possible without materially departing from the novel teachings and advantages of the subject matter recited in the claims. The order or sequence of any process or method steps may be varied or re-sequenced according to alternative embodiments. Other substitutions, modifications, changes and omissions may be made in the design, operating conditions and arrangement of the various exemplary embodiments without departing from the scope of the present inventions as expressed in the appended claims.

What is claimed is:

1. A method for determining the state of a battery using a microprocessor comprising the steps of:
   receiving measurements representative of at least one of a battery terminal voltage and a battery terminal current from a first unit;
   using a second unit to determine at least one characteristic variable for a battery state from at least one of the measured battery terminal voltage and the measured battery current;
   using a microprocessor to statistically assess the at least one characteristic variable for the battery state by performing a statistical process check;
   defining an observation window for the at least one characteristic variable within which the at least one characteristic variable is assumed to be steady-state; and
   identifying an implausible value, which is not caused by the battery, for the at least one characteristic variable if the scatter of the at least one characteristic variable exceeds a defined scatter limit.

2. The method according to claim 1, further comprising the step of identifying an implausible value for a determined characteristic variable if the absolute value of a mean scatter for the characteristic variable is greater than a defined scatter limit value.

3. The method according to claim 1, wherein the observation window is a time window.

4. The method according to claim 3, wherein the observation window is chosen as a function of the dynamics of the characteristic variable.

5. The method according to claim 1, wherein the observation window is a number of successive values considered for the characteristic variable.

6. The method according to claim 1, wherein only values of the at least one characteristic variable which are within the observation window are considered in the statistical assessment.

7. The method according to claim 1, wherein the characteristic variable is the loss of capacity of a rechargeable battery.

8. The method according to claim 2, further comprising calculating at least one of the mean scatter and a mean value for the characteristic variable by filtering.

9. The method according to claim 1, wherein the step of statistically assessing at least one determined characteristic variable for the battery state is carried out with the aid of at least one type of quality control chart.

10. The method according to claim 1, further comprising determining and statistically assessing a plurality of characteristic variables at the same time.

11. The method according to claim 10, further comprising combining the plurality of characteristic variables with one another to derive a battery state.

12. A device for battery state identification comprising:
    a unit for measuring at least one of battery terminal voltage and battery terminal current;
    a unit for determining at least one characteristic variable for the battery state from at least one of the measured battery terminal voltage and the measured battery current; and
    an assessment unit configured to statistically assess the at least one determined characteristic variable using a statistical process check;
    wherein the assessment unit is configured to define an observation window for the at least one characteristic variable within which the at least one characteristic variable is assumed to be steady-state;
    wherein the assessment unit is configured to identify an implausible value, which is not caused by the battery, for the at least one characteristic variable if the scatter of the at least one characteristic variable exceeds a defined scatter limit.

13. The device according to claim 12, wherein the assessment unit is further configured to identify an implausible value for a determined characteristic variable if the absolute value of a mean scatter for the characteristic variable is greater than a defined scatter limit value.

14. The device according to claim 12, wherein the assessment unit defines the observation window as a time window chosen as a function of the dynamics of the characteristic variable.

15. The device according to claim 12, wherein the assessment unit is configured to assess the loss of capacity of a rechargeable battery as the characteristic variable.

16. The device according to claim 12, wherein the assessment unit utilizes a quality control charge to assess the determined characteristic variable for the battery state.

* * * * *